United States Patent
Shin

(10) Patent No.: US 8,105,910 B2
(45) Date of Patent: Jan. 31, 2012

(54) METHOD FOR FORMING SILICIDE OF SEMICONDUCTOR DEVICE

(75) Inventor: Hee-Jae Shin, Gangnam-gu (KR)

(73) Assignee: Dongbu HiTek Co., Ltd., Seoul (KR)

( * ) Notice: Subject to any disclaimer, the term of this patent is extended or adjusted under 35 U.S.C. 154(b) by 91 days.

(21) Appl. No.: 12/565,892

(22) Filed: Sep. 24, 2009

(65) Prior Publication Data

US 2010/0072521 A1    Mar. 25, 2010

(30) Foreign Application Priority Data

Sep. 24, 2008   (KR) .................. 10-2008-0093482

(51) Int. Cl.
*H01L 21/336* (2006.01)
*H01L 21/3205* (2006.01)
*H01L 21/4763* (2006.01)
*H01L 21/44* (2006.01)

(52) U.S. Cl. ......... 438/301; 438/592; 438/305; 438/664

(58) Field of Classification Search .................. 438/301, 438/587, 682, 592, 584, 649, 655, 663, 651, 438/581, 583, 548, 510, 515, 519, 522, 527, 438/530, 369, 664, 533, 305, 306, 308
See application file for complete search history.

(56) References Cited

U.S. PATENT DOCUMENTS

| | | | | |
|---|---|---|---|---|
| 3,756,862 | A | * | 9/1973 | Ahn et al. .................. 438/308 |
| 5,837,568 | A | * | 11/1998 | Yoneda et al. .............. 438/147 |
| 6,333,216 | B1 | * | 12/2001 | Norstrom .................... 438/197 |
| 2008/0122005 | A1 | * | 5/2008 | Horsky et al. .............. 257/369 |

FOREIGN PATENT DOCUMENTS

KR    10-2007-0088927    8/2007

* cited by examiner

*Primary Examiner* — Chuong A. Luu
(74) *Attorney, Agent, or Firm* — Sherr & Vaughn, PLLC

(57) ABSTRACT

A silicide forming method for a semiconductor device. A silicide forming method may include forming a gate electrode by depositing a gate oxide film and/or polysilicon over a silicon substrate and patterning. A silicide forming method may include forming a nitride film spacer over sidewalls of a gate electrode and simultaneously performing source/drain implant and amophization implant over a silicon substrate. A silicide forming method may include depositing an insulating film after performing source/drain and amophization implants. A silicide forming method may include partially and/or entirely exposing a source/drain and/or gate electrode disposed under an insulating film by etching an insulating film. A silicide forming method may include applying a metal film over a silicon substrate and forming silicide over regions etched by performing heat treatment over a source/drain and/or gate electrode.

13 Claims, 4 Drawing Sheets

METHOD FOR FORMING SILICIDE OF SEMICONDUCTOR DEVICE

Figure 1:
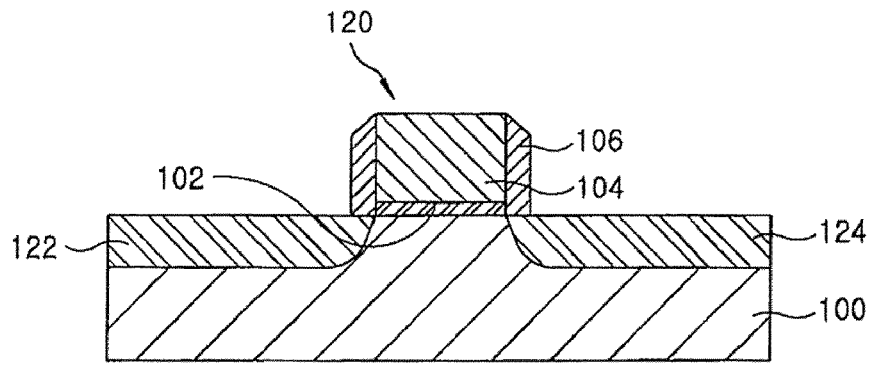

The present application claims priority under 35 U.S.C. 119 to Korean Patent Application No. 10-2008-0093482 (filed on Sep. 24, 2008) which is hereby incorporated by reference in its entirety.

BACKGROUND

Embodiments relate to electronic devices. Some embodiments relate to a semiconductor device manufacturing technology, including a method of forming silicide of a semiconductor device.

A semiconductor device may be relatively highly integrated. Therefore, a semiconductor design rule may trend toward miniaturization and operation speed of a device may become faster. Although a gate electrode of a transistor may become relatively small, a sheet resistance and/or a contact resistance may be problematic. To address these drawbacks, a technique to form a metal silicide may be developed. A metal silicide may have a relatively high melting point and/or a relatively low resistivity, and may be formed over a gate electrode of a polycrystalline silicon film and/or over a substrate including a source/drain. Resistance of a gate electrode and/or contact resistance of a source/drain may be relatively reduced.

A process of forming silicide over a gate electrode and/or a process of forming silicide over a source/drain may be separately performed. However, a salicide (self aligned silicide) process of forming silicide over a gate electrode and/or a source/drain in one process may be advantageous to address process simplification and/or cost reduction. In a salicide process, a relatively high melting point metal may be laminated between a silicon layer and an insulating layer. If the laminated layers are heated, a portion of a relatively high melting point metal over a silicon layer may react to form a salicide. A portion of a relatively high melting point metal over an insulating layer may remain without substantial change. A relatively high melting point metal that remains without change may be selectively etched to form a salicide layer.

When a transistor drives a large resistance may be generated, for example at an interface between metal wiring and a silicon substrate. Therefore, a metal (e.g., Co, Ti, Pt, W and the like) silicon compound may be used to form an Ohmic Contact between metal and silicon, and a source/drain implant of high concentration may be performed to form salicide.

Further steps to form a silicide may be included in a silicide forming process, preferably in a relatively easy manner which may improve a quality thereof. For example, an amorphization implant may be performed to obtain correct junction depth by suppressing ion channeling occurring in a same area before performing a silicide process other than the source/drain implant.

Therefore, there is a need for semiconductor device manufacturing technologies, including a method of forming silicide of a semiconductor device and/or to perform a source/drain implant process and an amophization implant process simultaneously. There is a need to simplify a process by simultaneously performing a source/drain implant and an amorphization implant when a silicide is formed over a silicon substrate.

SUMMARY

Embodiments relate to a silicide forming method for a semiconductor device. In embodiments, a silicide forming method may enable performing molecular implant which may use ionized molecules to simultaneously carry out a source/drain implant and an amorphization implant.

According to embodiments, a semiconductor device may be capable of forming silicide of a semiconductor device by simultaneously performing a source/drain implant and an amorphization implant using Decaborane ($B_{10}H_{14}$) and/or Octadecaborane ($B_{18}H_{22}$), and an ion injection energy between approximately 10 keV and 20 keV.

According to embodiments, a silicide forming method for a semiconductor device may include forming a gate electrode. In embodiments, a gate electrode may be formed by depositing a gate oxide film and polysilicon over a silicon substrate and performing patterning. In embodiments, a silicide forming method may include forming a nitride film spacer over sidewall(s) of a gate electrode and simultaneously performing a source/drain implant and a mophization implant over a silicon substrate.

According to embodiments, a source/drain implant and an amorphization implant may be simultaneously performed by applying a cluster ion beam to thereby simplify a semiconductor manufacturing process, amorphizate a silicon surface with a relatively high atom mass, and/or form a relatively ultra shallow junction which may be a task of ion implantation according to a device integration.

DRAWINGS

Example FIG. 1 is a cross sectional view illustrating a semiconductor substrate to form silicide in accordance with embodiments.

Figure 2:
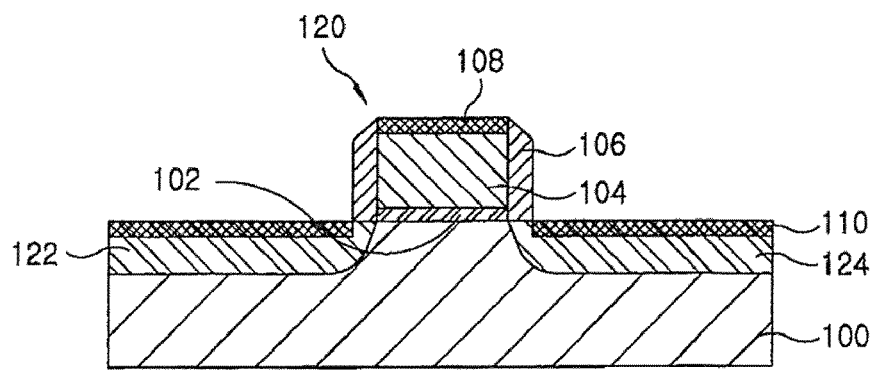

Example FIG. 2 is a cross sectional view illustrating a semiconductor substrate processed to form a silicide in accordance with embodiments.

Figure 3:
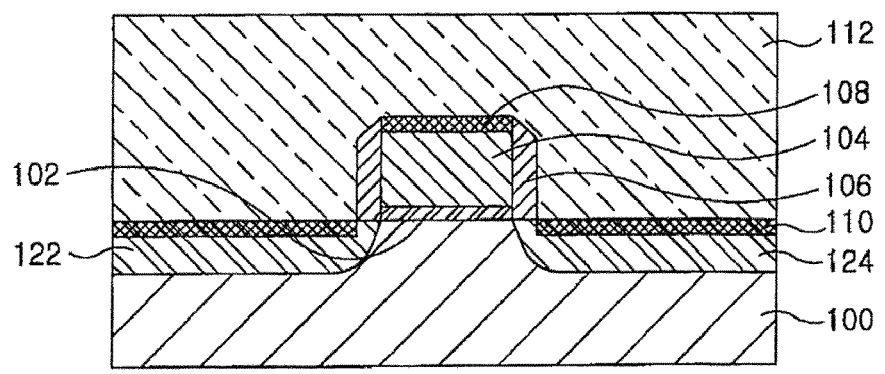

Example FIG. 3 is a cross sectional view illustrating a semiconductor substrate deposited with non-silicide Plasma Enhanced-Tetra Ethyl Ortho Silicate (PE-TEOS) film thereover in accordance with embodiments.

Figure 4:
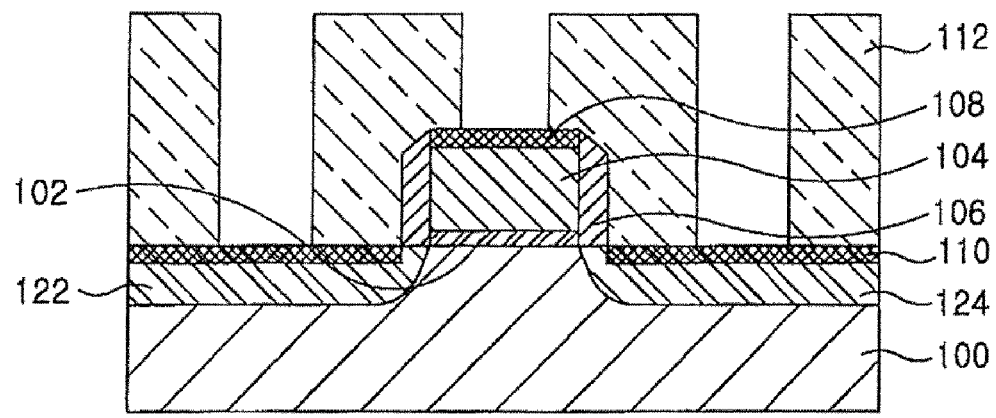

Example FIG. 4 is a cross sectional view illustrating a semiconductor substrate over which a region to be formed with silicide is etched in accordance with embodiments.

Figure 5:
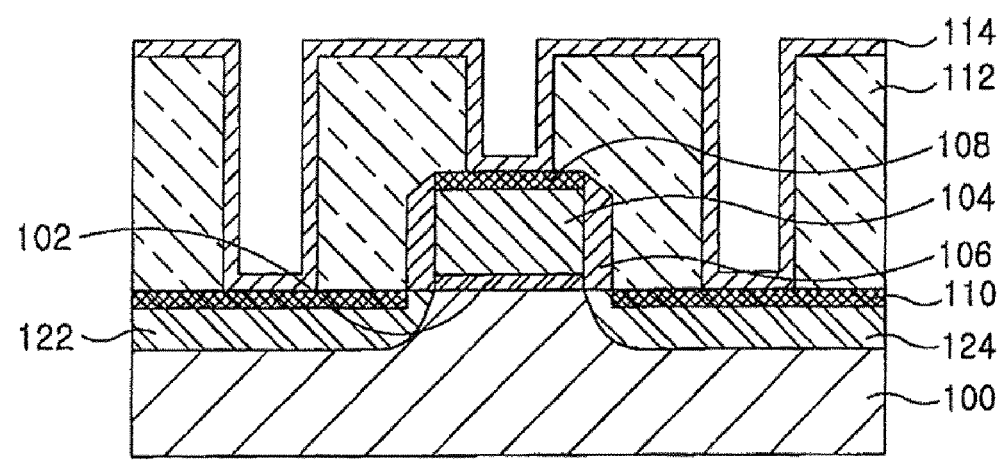

Example FIG. 5 is a cross sectional view illustrating a semiconductor substrate over which a metal film may be applied to form a silicide in accordance with embodiments.

Figure 6:
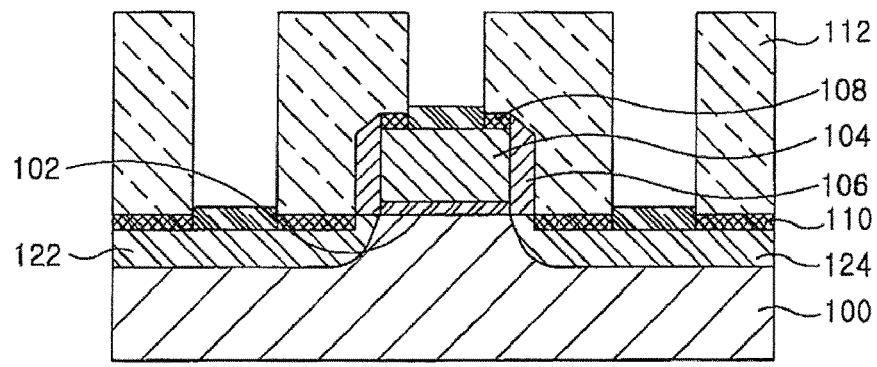

Example FIG. 6 is a cross sectional view illustrating a semiconductor substrate formed including silicide thereover in accordance with embodiments.

Figure 7:
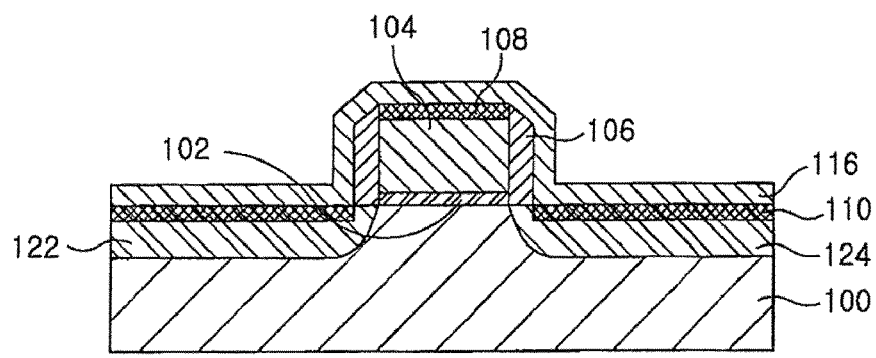

Example FIG. 7 is a cross sectional view illustrating a semiconductor substrate over which a metal film may be formed to form silicide in accordance with embodiments.

Figure 8:
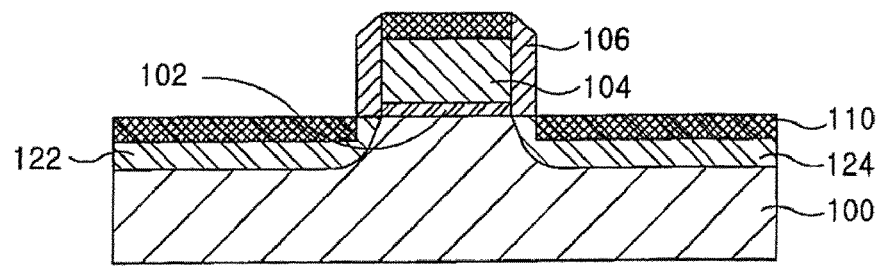

Example FIG. 8 is a cross sectional view illustrating a semiconductor substrate formed including a substrate thereover in accordance with embodiments.

Figure 9:
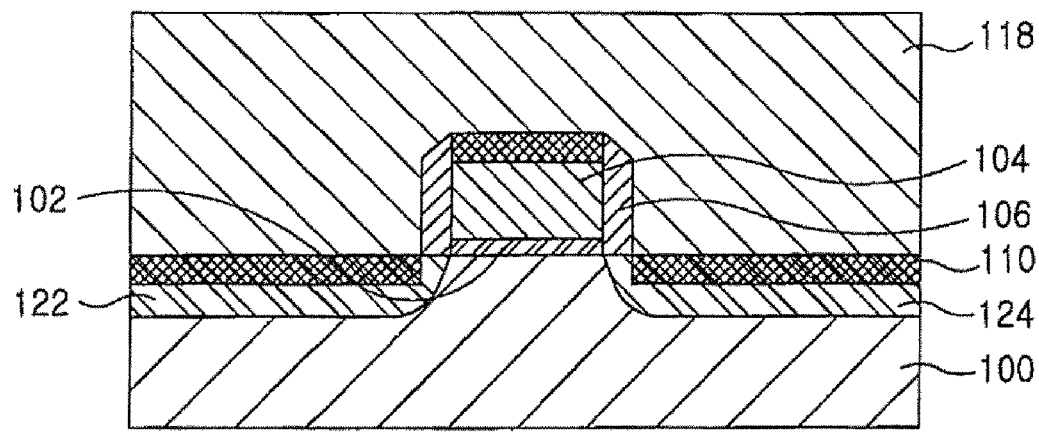

Example FIG. 9 is a cross sectional view illustrating a semiconductor substrate over which silicide may be formed in accordance with embodiments.

Figure 10:
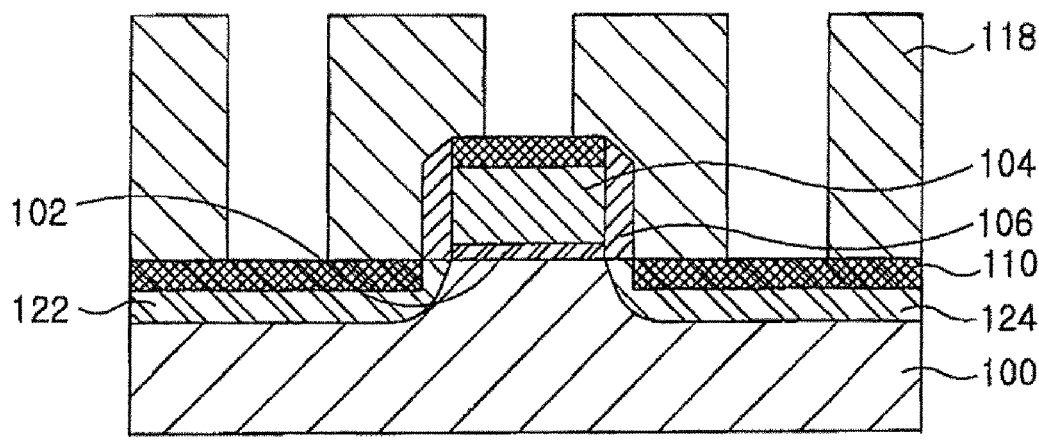

Example FIG. 10 is a cross sectional view illustrating a semiconductor substrate over which a contact may be formed by etching an insulating film formed over a substrate in accordance with embodiments.

DESCRIPTION

Referring to example FIG. 1 to FIG. 4, a process is illustrated of performing a source/drain implant and an amorphization implant simultaneously when silicide is formed. Referring to FIG. 1, a cross sectional view illustrates a substrate for forming silicide in accordance with embodiments. According to embodiments, gate oxide film 102 and/or polysilicon 104 may be deposited over a substrate, such as silicon substrate 100. In embodiments, a structure formed including gate oxide film 102 and polysilicon 104 may be patterned to form gate electrode 120. An anisotropy etching process may be used in accordance with embodiments. In embodiments, spacer 106 may be formed over sidewalls of gate electrode 120. In embodiments, spacer 106 may operate as a mask and/or a barrier in an implant process.

Referring to FIG. 2, a semiconductor substrate processed to form a silicide in accordance with embodiments is illustrated. According to embodiments, an implant may be performed over source 122, drain 124 and/or gate electrode 120. In embodiments, an implant may be performed including molecular implant over silicon substrate 100 having gate electrode 120 and/or spacer 106. In embodiments, an implant may relate to molecular implant using ionized molecules having atomic mass greater than that of silicon.

According to embodiments, a source/drain implant and an amorphization implant may be simultaneously performed. In embodiments, a source/drain implant and an amorphization implant may be performed using boron, such as boron compounds including decaborane ($B_{10}H_{14}$) and/or octadecaborane ($B_{18}H_{22}$). In embodiments, a source/drain implant and an amorphization implant may be performed using an ion injection energy between approximately 10 keV and 20 keV, depending on a device. In embodiments, a dose of boron compounds may be between 1E-15 ions/cm$^3$ to 5E-15 ions/cm$^3$, as in a source/drain formation. In embodiments, when octadecaborane is used, an ion injection energy may be approximately 20 keV and a boron ions' ion injection energy may be approximately 1 keV, thereby satisfying a relatively ultra shallow junction condition.

Referring to FIG. 3, a cross sectional view illustrates a semiconductor substrate deposited having a non-silicide film thereover, such as Plasma Enhanced-Tetra Ethyl Ortho Silicate (PE-TEOS) film 112. According to embodiments, PE-TEOS film 112 may be formed as an insulating film. In embodiments PE-TEOS film 112 may distinguish a region to be formed having silicide after simultaneously performing a source/drain implant and an amorphization implant by using cluster ions, for example as illustrated in FIG. 2.

Referring to FIG. 4, a cross sectional view illustrates a semiconductor substrate over which a region to be formed having silicide may be etched. According to embodiments, a region to be formed having silicide may be selectively etched over PE-TEOS film 112 using a photo mask.

Referring to example FIG. 5, a cross sectional view illustrates a semiconductor substrate over which a metal film may be applied to form a silicide in accordance with embodiments. In embodiments, a region where silicide may be formed, for example as illustrated in FIG. 4 through etching, may include source 122, drain 124 and/or gate electrode 120. In embodiments, implant may be performed and a region where silicide may be formed may be exposed. In embodiments, metal film 114 may be applied over semiconductor substrate 100 over which PE-TEOS film 112, source 122, drain 124 and/or gate electrode 120 may be formed. In embodiments, a metal used to form metal film 114 may include Titanium, Cobalt and/or Nickel. In embodiments, an annealing process may be performed over source 122, drain 124, and/or gate electrode 120 where metal film 114 may be applied. In embodiments, metal film 114 which does not react with silicide may be removed by selective etching.

Referring to example FIG. 6, silicide may be partially or substantially entirely formed over source 122, drain 124 and/or gate electrode 120 where PE-TEOS film 112 is etched. According to embodiments, silicide may be partially or substantially entirely formed through a heat treatment process and removal of metal 114 which does not react with silicide. In embodiments, silicide may be formed by applying where PE-TEOS film 112 and/or metal 114 as illustrated in FIG. 3 to FIG. 6, although a silicide forming process in accordance with embodiments is not limited hereto.

Referring to example FIG. 7, a cross sectional view illustrates a substrate, such as a semiconductor substrate, over which a metal film may be formed to fabricate silicide in accordance with embodiments. According to embodiments, an implant may be performed, for example as illustrates in FIG. 2. In embodiments, metal film 116 may include Titanium, Cobalt, and/or Nickel and the like, and may be applied over semiconductor substrate 100 over which source 122, drain 124 and/or gate electrode 120 may be formed.

According to embodiments, source 122, drain 124 and/or gate electrode 120 formed over semiconductor substrate 100 over which metal film 116 may be applied may be heat treated to form silicide over source 122, drain 124 and/or gate electrode 120. In embodiments, metal film 116 which may not react with silicide may be removed, for example by etching, to form silicide over semiconductor substrate 100 as illustrated for example in example FIG. 8.

Referring to example FIG. 9, a cross sectional view illustrates a semiconductor substrate over which silicide and an insulating film may be formed. According to embodiments, a silicide and an insulating film may be formed in that order. In embodiments, PE-TEOS film 118 may be formed as an insulating film over semiconductor substrate 100 over which silicide may have been formed. In embodiments, PE-TEOS film 118 formed may be selectively etched to partially and/or substantially entirely expose source 122, drain 124 and/or gate electrode 120. In embodiments a semiconductor substrate may be obtained having a form as illustrated in example FIG. 10.

According to embodiments, a source/drain and an amorphization implant may be performed over a silicon substrate, over which a gate electrode and spacer may be formed. In embodiments, implants may be formed by using decaborane ($B_{10}H_{14}$) and/or octadecaborane ($B_{18}H_{22}$). In embodiments, implants may be formed using decaborane ($B_{10}H_{14}$) and/or octadecaborane ($B_{18}H_{22}$) with an ion injection energy between approximately 10 keV to 20 keV. In embodiments, a semiconductor device manufacturing process may be simplified.

It will be obvious and apparent to those skilled in the art that various modifications and variations can be made in the embodiments disclosed. Thus, it is intended that the disclosed embodiments cover the obvious and apparent modifications and variations, provided that they are within the scope of the appended claims and their equivalents.

What is claimed is:

1. A method comprising:
   depositing a gate oxide film and polysilicon over a silicon substrate;
   patterning at least one of said gate oxide film and polysilicon to form a gate electrode;
   forming a spacer over said gate electrode;
   simultaneously performing a source/drain implant and an amorphization implant over the substrate, wherein said simultaneously performing source/drain implant and amorphization implant comprises molecule implant using ionized molecules;
   depositing an insulating film after performing said source/drain implant and amorphization implant;

exposing at least a portion of said source/drain and a portion of said gate electrode disposed under said insulating film by etching regions of said insulating film;

applying a metal film over said insulating film and the exposed portion of said source/drain and gate electrode; and forming silicide over the etched regions by performing heat treatment over said source/drain and gate electrode.

2. The method of claim 1, wherein said insulating film comprises Plasma Enhanced-Tetra Ethyl Ortho Silicate.

3. The method of claim 1, wherein said metal film comprises at least one of Ti, Co and Ni.

4. The method of claim 1, wherein the atomic mass of said ionized molecules is greater than silicon.

5. The method of claim 4, wherein said ionized molecules comprise boron.

6. The method of claim 5, wherein said ionized molecules comprise boron compounds including at least one of decaborane and octadecaborane.

7. The method of claim 6, comprising an implantation energy between approximately 10 keV and 20 keV.

8. The method of claim 6, comprising a dose of said boron compounds between approximately 1E-15 ions/cm$^3$ and 5E-15 ions/cm$^3$.

9. The method of claim 6, comprising octadecaborane having an ion injection energy at approximately 20 keV and a boron ion injection energy at approximately 1 keV.

10. A method comprising:

depositing a gate oxide film and polysilicon over a silicon substrate;

patterning at least one of said gate oxide film and polysilicon to form a gate electrode;

forming a spacer over said gate electrode;

simultaneously performing a source/drain implant and an amorphization implant over the substrate, wherein said simultaneously performing source/drain implant and amorphization implant comprises molecule implant using ionized molecules;

applying a metal film over the substrate to form silicide after said performing source/drain implant and amorphization implant; and forming silicide over the source/drain and the gate electrode comprising by performing a heat treatment over said applied metal film.

11. The method of claim 10, wherein said metal film comprises at least one of Ti, Co and Ni.

12. The method of claim 10, comprising:

depositing an insulating film over the silicide layer formed on the substrate; and forming a contact over a region comprising the silicide.

13. The method of claim 12, wherein said insulating film comprises Plasma Enhanced-Tetra Ethyl Ortho Silicate.

* * * * *